United States Patent
Rossini et al.

(10) Patent No.: US 9,230,850 B2
(45) Date of Patent: Jan. 5, 2016

(54) METHOD FOR MANUFACTURING A MULTILAYER STRUCTURE ON A SUBSTRATE

(71) Applicant: Commissariat à l'énergie atomique et aux énergies alternatives, Paris (FR)

(72) Inventors: Umberto Rossini, Coublevie (FR); Raphaël Eleouet, Moirans (FR); Thierry Flahaut, Cholonge (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 1 day.

(21) Appl. No.: 14/369,699

(22) PCT Filed: Dec. 27, 2012

(86) PCT No.: PCT/FR2012/053090
§ 371 (c)(1),
(2) Date: Jun. 29, 2014

(87) PCT Pub. No.: WO2013/098529
PCT Pub. Date: Jul. 4, 2013

(65) Prior Publication Data
US 2014/0363951 A1   Dec. 11, 2014

(30) Foreign Application Priority Data
Dec. 29, 2011 (FR) .................... 11 62524

(51) Int. Cl.
*C30B 25/12* (2006.01)
*H01L 21/762* (2006.01)
*C30B 25/02* (2006.01)

(52) U.S. Cl.
CPC .......... *H01L 21/76259* (2013.01); *C30B 25/02* (2013.01); *C30B 25/12* (2013.01); *H01L 21/76251* (2013.01)

(58) Field of Classification Search
CPC ................ C30B 25/02; C30B 25/12
See application file for complete search history.

(56) References Cited

U.S. PATENT DOCUMENTS 6,280,523 B1 * 8/2001 Coman et al. ............... 117/101
(Continued)

FOREIGN PATENT DOCUMENTS

| FR | 2789518 A1 | 8/2000 |
|---|---|---|
| FR | 2848337 A1 | 6/2004 |
| JP | 2006509377 | 3/2006 |

OTHER PUBLICATIONS

European Patent Office, International Search Report for PCT/FR2012/053090, Feb. 18, 2013 (Translation of Previously Submitted non-English language version).
(Continued)

*Primary Examiner* — Robert M Kunemund
(74) *Attorney, Agent, or Firm* — Kevin R Erdman; Brannon Sowers & Cracraft PC

(57) ABSTRACT

The invention relates to a method for manufacturing a multilayer structure on a first substrate made of a material having a first Young's modulus. The method includes: providing a second substrate covered with the multilayer structure, the multilayer structure having a planar surface opposite the second substrate, the second substrate being made of a material having a second Young's modulus; applying first deformations to said surface; molecularly boding the first substrate to said surface, the molecular bonding resulting in the appearance of second deformation in said surface in the absence of the first deformations, the first deformations being opposite the second deformations; and removing the second substrate, the resulting deformations in said surface being less than 5 ppm.

20 Claims, 4 Drawing Sheets

(56) References Cited

U.S. PATENT DOCUMENTS

| | | | |
|---|---|---|---|
| 6,497,763 B2 * | 12/2002 | Kub et al. | 117/94 |
| 6,756,285 B1 | 6/2004 | Moriceau | |
| 2006/0141742 A1 | 6/2006 | Fournel et al. | |
| 2006/0205179 A1 | 9/2006 | Fournel et al. | |
| 2009/0102008 A1 | 4/2009 | Kakehata | |

OTHER PUBLICATIONS

European Patent Office, International Preliminary Report on Patentability for PCT/FR2012/053090, undated translation.

European Patent Office, International Search Report for PCT/FR2012/053090, Feb. 18, 2013.

Office Action for parallel application JP 2014-549524, dated Nov. 12, 2014.

* cited by examiner

US 9,230,850 B2

METHOD FOR MANUFACTURING A MULTILAYER STRUCTURE ON A SUBSTRATE

CROSS-REFERENCE TO RELATED APPLICATIONS

The present application is a National Stage of PCT International Application Serial Number PCT/FR2012/053090, filed Dec. 27, 2012, which claims priority under 35 U.S.C. §119 of French Patent Application Serial Number 11/62524, filed Dec. 29, 2011, the disclosures of which are incorporated by reference herein.

BACKGROUND OF THE INVENTION

1. Field of the Invention

The present invention relates to a method of manufacturing a multilayer structure, for example corresponding to an integrated circuit wafer, on a support by molecular bonding.

2. Description of the Related Art

For certain applications, it is desirable to form an integrated circuit wafer on a support. In particular, for applications in optics, the support should be insulating and transparent. It for example is glass. An example of application relates to the manufacturing of a transmissive display screen.

FIGS. 1A to 1C show simplified cross-section views of structures obtained at successive steps of a method of manufacturing an integrated circuit wafer on a support by molecular bonding.

FIG. 1A schematically shows an element 10 having an SOI (Silicon On Insulator) structure.

Element 10 comprises an initial support 12, for example, a single-crystal silicon substrate. Thickness es of initial support 12 is for example several hundred micrometers and is, for example, equal to approximately 700 μm. Initial support 12 may correspond to a cylinder having a diameter greater than some hundred millimeters, and is equal, for example, to approximately 200 mm or 300 mm. Initial support 12 comprises a planar surface 13 covered with an insulating layer 14, for example, made of silicon dioxide. Thickness e2 of insulating layer 14 is for example in the order of 1 μm. Insulating layer 14 is covered with an integrated circuit wafer 16. Integrated circuit wafer 16 comprises a stack of layers having active and/or passive electronic components and conductive tracks connecting these components. As an example, integrated circuit wafer 16 comprises a layer 18 of a semiconductor material, for example, single-crystal silicon, covering insulating layer 14 and having the active and/or passive electronic components, for example, transistors 20, formed inside and on top of it. Integrated circuit wafer 16 further comprises a stack of insulating layers 22, for example, made of silicon dioxide, covering silicon layer 18 and having tracks 24 and vias 26 of a conductive material, capable of coming into contact with the electronic components, formed therein. As an example, thickness e3 of wafer 16 is in the order of a few micrometers. The last insulating layer of stack 22 of insulating layers forms a planar upper surface 28 opposite to support 12.

FIG. 1B shows the structure obtained after the performing of a molecular bonding between surface 28 of element 10 and a final support 30. Final support 30 is made of a material different from silicon, for example, made of glass. Thickness ev of final support 30 is greater than several hundred micrometers, and is, for example, equal to approximately 700 μm. Final support 30 comprises a surface 32 applied against surface 28. Molecular bonding comprises creating a bond between surfaces 28 and 32 with no addition of external material (such as glue or an adhesive material). To achieve this, surfaces 28 and 32, properly cleaned, are placed in contact with each other at ambient temperature. A pressure may be locally exerted on support 30 to initiate the bonding. The propagating front of the bonded area then spreads from the initiation region over all the opposite surfaces.

FIG. 1C shows the structure obtained after the removal of initial support 12. The removal of initial support 12 may comprise a step of chem.-mech. polishing to remove most of initial support 12, followed by a step of selective chemical etching to remove the rest of initial support 12. Insulating layer 14 may be used as a stop layer on removal of initial support 12.

The method then generally carries on with the forming of conductive vias through insulating layer 14 and silicon layer 18 and connected to metal tracks 24 of integrated circuit wafer 16. The forming of these vias comprises photolithography steps, including steps where a resist layer covering insulating layer 14 is exposed to a radiation through a mask to reproduce the mask pattern on the resin layer. To achieve this, the exposure device, which particularly comprises the optical systems for forming the pattern in the resist layer, should be accurately placed with respect to integrated circuit wafer 16.

In an industrial scale manufacturing process, the photolithography steps should be carried out as fast as possible. To achieve this, the exposure device is previously adjusted so that the pattern to be transferred forms properly with no additional adjustment in the resin layer for an integrated circuit wafer which would have the expected dimensions.

However, deformations can be observed in integrated circuit wafer 16 after the bonding step. In particular, a narrowing is observed, that is, two marks formed on bonding surface 28 before the bonding step have come closer to each other after the bonding step.

Further, the relative deformations observed in integrated circuit wafer 16 in a plane parallel to surface 28 generally vary according to the considered direction. Thereby, the observed relative narrowing may vary between approximately 16 ppm and 24 ppm along the considered direction, parallel to surface 28.

An average deformation of 20 ppm can generally be compensated for by the exposure device. However, in certain cases, the average deformation may be too large to be compensated for by the exposure device. Further, it is not possible to correct, with the exposure device, relative deformation differences which vary along the considered direction. Thereby, there may be misalignments between the exposure device and the integrated circuit wafer during the photolithography steps carried out after the bonding.

A method of manufacturing by molecular bonding a multilayer structure, for example, corresponding to an integrated circuit wafer, on a support where deformations in the integrated circuit wafer which result from the bonding operation are decreased, or even suppressed, is thus needed.

SUMMARY OF THE INVENTION

An object of the present invention is to provide a method of manufacturing a multilayer structure on a support by molecular bonding which overcomes the disadvantages of known methods.

According to another object of the present invention, the relative deformations in the multilayer structure which result from the bonding operation are smaller than 5 ppm.

According to another object of the present invention, the manufacturing method using a molecular bonding comprises a decreased number of additional steps as compared with a known manufacturing method using molecular bonding.

Thus, the present invention provides a method of manufacturing a multilayer structure on a first support made of a first material having a first Young's modulus. The method comprises the successive steps of:

providing a second support covered with the multilayer structure, the multilayer structure having a planar surface opposite to the second support, the second support being made of a second material having a second Young's modulus different from the first Young's modulus;

applying to said surface first deformations;

performing a molecular bonding of the first support onto said surface, the molecular bonding causing the occurrence of second deformations in said surface in the absence of the first deformations, the first deformations being opposite to the second deformations; and removing the second support, the resulting relative deformations in said surface being smaller than 5 ppm.

The fact for the first deformations to be opposite to the second deformations means that the first deformations are substantially equal in absolute value to the second deformations and have opposite directions.

According to an embodiment of the invention, said surface is deformed by applying the second support on a template.

According to an embodiment of the invention, said surface is deformed by maintaining the center of the second support fixed and by displacing the periphery of the second support.

According to an embodiment of the invention, the first deformations vary according to the crystallographic directions of the second support.

According to an embodiment of the invention, the application of the first deformations comprises stretching said surface.

According to an embodiment of the invention, the second support is made of single-crystal silicon, said surface being a (001) crystallographic surface, the second support being a cylinder having a rotational symmetry axis, and the first deformations having a rotational symmetry of order 4 around said axis.

According to an embodiment of the invention, the application of the first deformations comprises applying, in a first plane containing said axis and crystallographic direction [100] or [010] of the second support, a first spacing, measured along said axis, between the center and the periphery of said surface, and in a second plane containing said axis and crystallographic direction [110] of the second support, a second spacing, measured along said axis, between the center and the periphery of said surface, the first spacing being smaller than the second spacing.

According to an embodiment of the invention, the first material is isolating.

According to an embodiment of the invention, the first material is transparent.

According to an embodiment of the invention, the first material is glass.

BRIEF DESCRIPTION OF THE DRAWINGS

The foregoing and other features and advantages will be discussed in detail in the following non-limiting description of specific embodiments in connection with the accompanying drawings, among which.

DESCRIPTION OF EMBODIMENTS OF THE PRESENT INVENTION

Figure 1A:
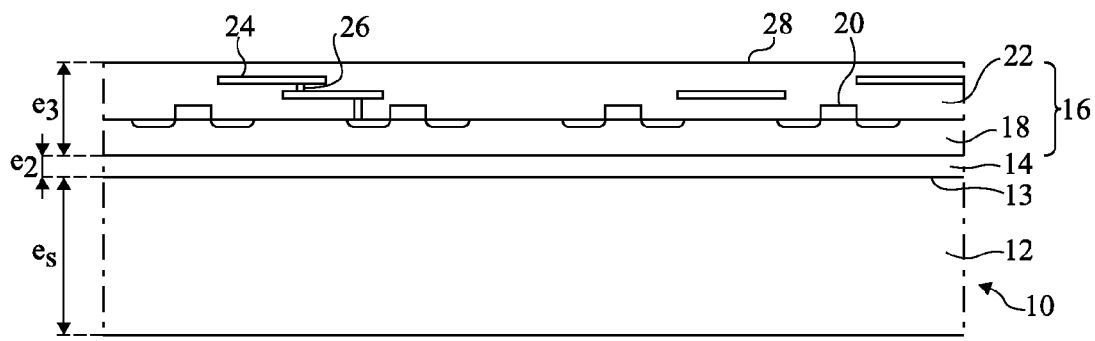
FIGS. 1A to 1C, previously described, show the structures obtained at successive steps of a known method of manufacturing an integrated circuit wafer on an insulating support.
Figure 1B:
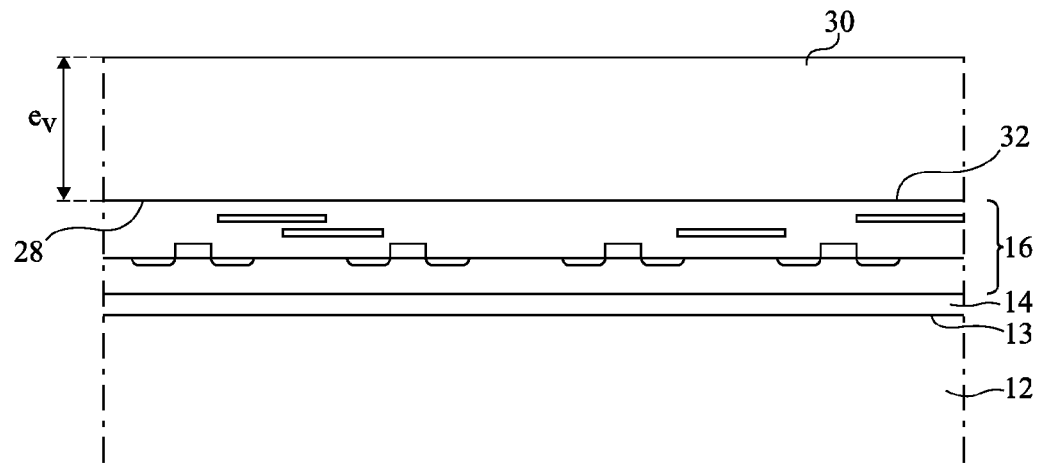
Figure 1C:
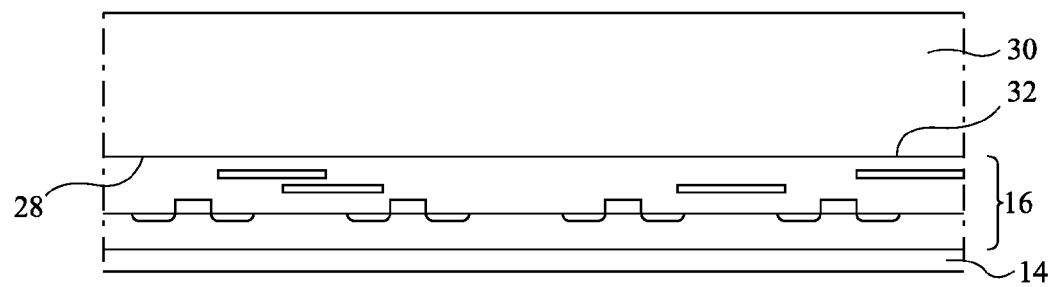

For clarity, the same elements have been designated with the same reference numerals in the various drawings and, further, as usual in the representation of integrated circuits, the various drawings are not to scale.

The principle of the invention is based on an analysis of the physical phenomena which occur during an operation of molecular bonding of two supports comprising materials of different natures. At the propagating front of the bonded area, a local stretching of the supports can be observed. When the Young's modules of the materials of the supports are different, the resulting local deformations are not identical. The bonded surface of the support having the lowest Young's modulus stretches more than the bonded surface of the support having the highest Young's modulus. The bonding then occurs while the supports are deformed. After having bonded the two supports and having removed one of the supports to only leave a thin layer bonded to the other support, deformations can be observed in the thin layer.

Generally, on bonding of an integrated circuit wafer on a final glass support, the integrated circuit wafer rests on an initial support, which is removed afterwards, and which is a single-crystal silicon substrate. The inventors have shown that, during the molecular bonding of the integrated circuit wafer on the final support, the resulting deformations observed in the integrated circuit wafer are essentially due to the nature of the initial support material used to apply the integrated circuit wafer against the final support. Indeed, the thickness of the integrated circuit wafer is low as compared with the thickness of the initial support, and it may be neglected. The Young's modulus of glass is smaller than the Young's modulus of silicon so that, after the bonding, a negative relative enlargement can be observed in a plane of the integrated circuit wafer parallel to the bonded surfaces which depends on the considered direction.

The inventors have shown that relative deformation differences in the integrated circuit wafer originate from the anisotropic mechanical properties of the material forming the initial support. In particular, the inventors have shown that relative deformation differences in the integrated circuit wafer are due to variations of the Young's modulus of the material forming the initial support along the direction considered in a plane parallel to the bonded surfaces.

Figure 2:
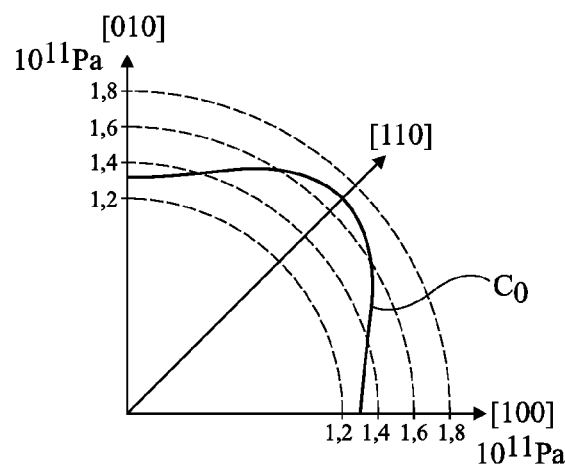
FIG. 2 shows the variation of the Young's modulus in a (100) plane of a single-crystal silicon support.

FIG. 2 shows a curve C0 of the variation of the Young's modulus in a (100) crystallographic plane of single-crystal silicon support 12. The Young's modulus varies between a value of approximately 130 GPa for crystallographic directions [100] and [010] and a value of 170 GPa for crystallographic direction [110].

For SOI structures currently available for sale, surface 13 of initial silicon support 12 generally corresponds to a (100) crystallographic surface. The inventors have observed that the relative narrowing is in the order of 16 ppm in crystallographic directions [100] and [010] and is in the order of 24 ppm in crystallographic direction [110].

Figure 3:
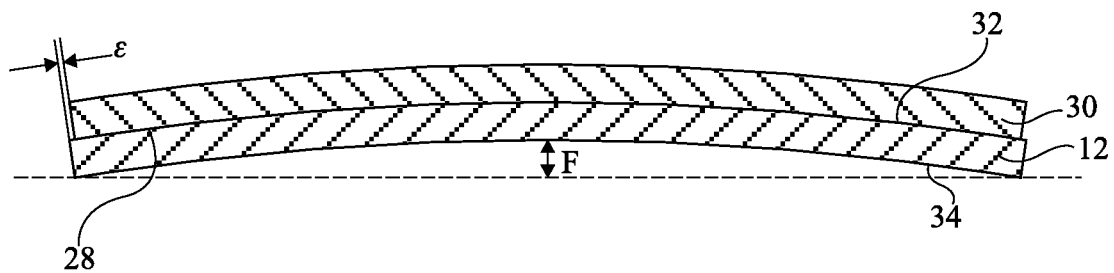
FIG. 3 is a simplified cross-section view illustrating the principle of the invention.

FIG. 3 illustrates the principle of the present embodiment of the invention. The inventors have shown that it is possible to compensate for deformations resulting from the molecular bonding of two supports of materials having different Young's modules by applying a determined deformation to one of the supports before and during the bonding.

More specifically, FIG. 3 shows initial support 12 and final support 30. The inventors have shown that insulating layer 14 and wafer 16, having thicknesses much smaller than the thicknesses of supports 12, 30 which may be neglected, and it can be considered that surface 28 is the surface of support 12. Support 12 is made of single-crystal silicon and support 30 is made of glass so that a molecular bonding between supports 12, 30 causes a narrowing of surface 28 of support 12. The principle of the invention is to deform silicon support 12 before the bonding and to bond support 30 to support 12 while support 12 is deformed. More specifically, silicon support 12 is deformed by maintaining the center of support 12 fixed and by displacing certain points of the periphery of support 12 by a distance F. Surface 28 of support 12 is then stretched while surface 34 of support 12 opposite to surface 28 is compressed. If it is considered that support 30 is only laid without bonding on surface 28 of support 12, it takes the shape of support 12 so that surface 32 of support 30 is compressed. When the two supports 12 and 30 correspond to cylinders of same radius r, an interval □ appears between the peripheral edge of support 30 and the peripheral edge of support 12. Interval □ depends on distance F. The value of distance F is selected so that interval □ is equal, in absolute value, to the relative narrowing between support 12 and support 30 after bonding in the absence of a prior deformation of support 12. The inventors have shown that, after bonding and releasing of support 12, the narrowing of support 12 is then substantially nonexistent.

Generally, distance F is obtained by relation (1) hereafter:

$$F = \frac{1}{2}\frac{r^2}{e_s}\varepsilon \quad (1)$$

Distance F, to be applied to compensate for deformations due to bonding, may be obtained by relation (2) hereafter:

$$F = \sqrt{\frac{3}{4}\xi_{coll}\frac{r^4}{e_s^3}\frac{(E_s - E_v)^2}{E_s E_v(E_s + E_v)}} \quad (2)$$

where Ev is the Young's modulus of the final support, Es is the Young's modulus of the initial support, and ξcoll is a portion of the bonding energy.

As a variation, silicon support 12 may be deformed by maintaining a point or several points of the periphery of support 12 fixed and by deforming the rest of the periphery of silicon support 12.

Figure 4:
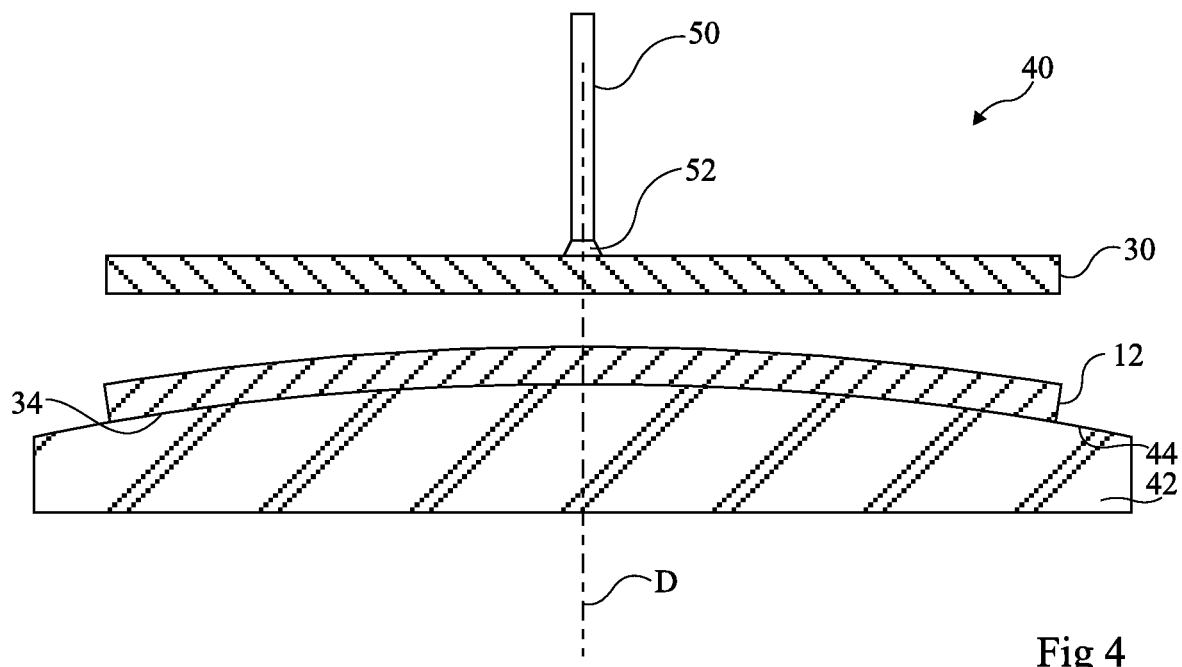
FIG. 4 is a simplified cross-section view of an embodiment of a support deformation system according to the invention.

FIG. 4 shows an embodiment of a system 40 capable of performing a molecular bonding between supports 12 and 30 while maintaining support 12 under a deformed shape.

System 40 comprises a template 42. Template 42 comprises a bearing surface 44 having support 12 applied against it. Surface 44 is a curved surface having a shape adapted to obtain the desired deformation of support 12. Template 42 further comprises a suction system, not shown. The suction system is capable of maintaining surface 34 of support 12 against surface 44. Template 42 is for example made of a ceramic material. Template 42 may further comprise a coating, for example, made of Teflon, on surface 44 to ease the lateral sliding of support 12 during the molecular bonding.

System 40 further comprises a mobile arm 50 shiftable along an axis D, for example, vertical. Arm 50 comprises at one end a gripping element 52, for example, a suction cup or a suction element. Support 30 is maintained by gripping element 52 of arm 50. Preferably, when supports 12, 30 are cylindrical, axis D corresponds to the axis of supports 12, 30.

To perform the molecular bonding of support 30 on support 12, mobile arm 50 is brought towards template 42 until support 30 comes into contact with support 12 at the level of axis D. The forces present during the bonding are sufficient to deform support 30 which then takes the shape of support 12.

Figure 5:
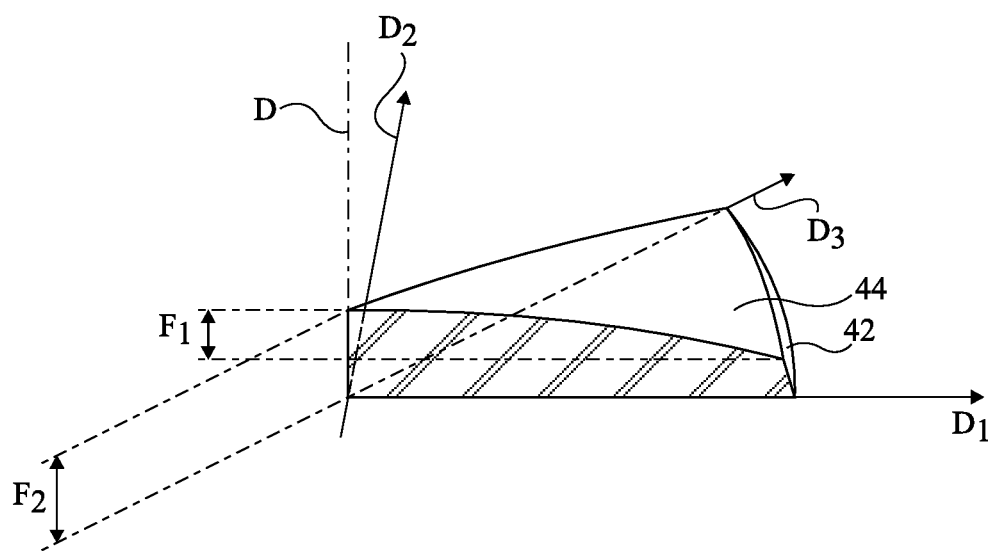
FIG. 5 shows a perspective view with a cross-section of the template of the deformation system of FIG. 4.

FIG. 5 is a perspective view of a sector of an embodiment of template 42 adapted to the case where support 12 is made of silicon and surface 28 is a (100) crystallographic surface. The sector corresponds to ⅛th of template 42. Surface 44 has a rotational symmetry around axis D of order 4. Call D1, D2, and D3, respectively, crystallographic directions [100], [010], and [110] of surface 28 of support 12. In the planes containing axis D and directions D1 and D2, surface 44 corresponds to the deflection obtained for a spacing F1 and in the plane containing axis D and direction D3, surface 44 corresponds to the deflection obtained for a spacing F2. Spacing F2 is greater than spacing F1. Spacing values F1 and F2 can be determined from relation (2) and the following values:

Young's modulus Ev equal to 70 GPa;
Young's modulus Es equal to 130 GPa in crystallographic direction [100] or [010] and equal to 170 GPa in crystallographic direction [110];
bonding energy portion ξcoll equal to 30 mJ/m2;
radius r equal to 100 mm; and
thickness es equal to 700 μm.

As an example, spacing F1 is in the order of 122 micrometers and spacing F2 is in the order of 163 micrometers.

Figure 6:
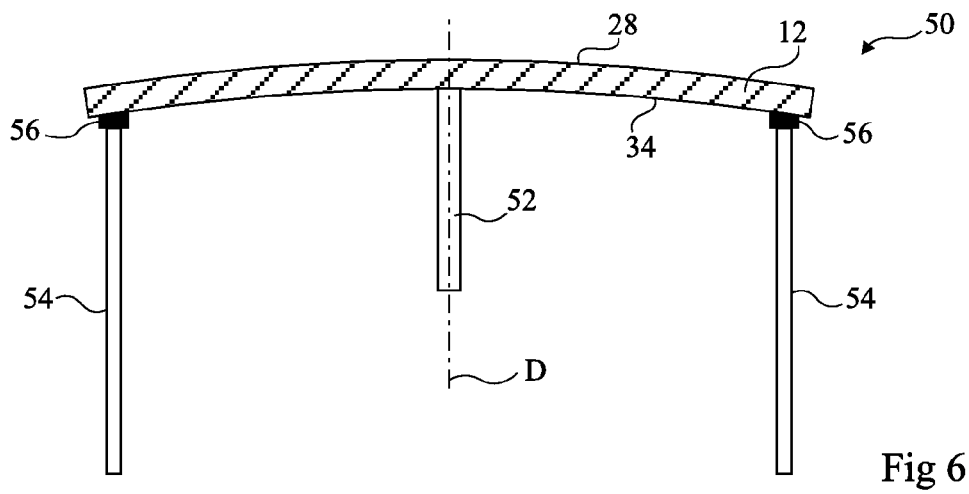
FIGS. 6 and 7 respectively are a lateral simplified cross-section view and a bottom view, partial and simplified, of another embodiment of a support deformation system according to the invention.
Figure 7:
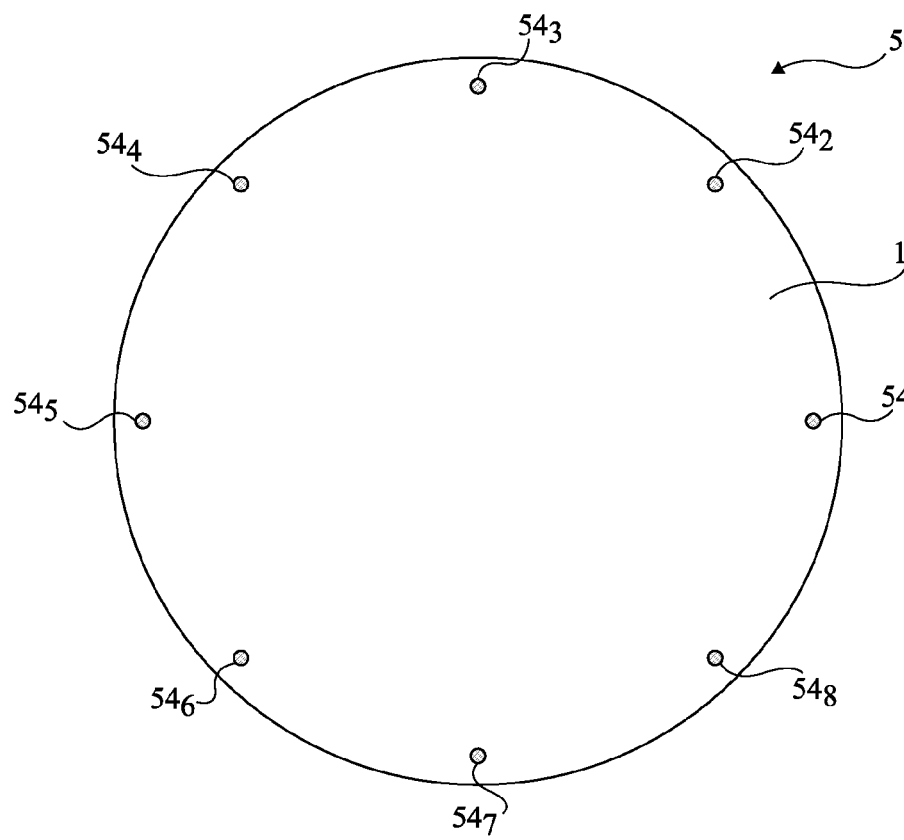

FIGS. 6 and 7 partially and schematically show another embodiment of a system 50 capable of performing a molecular bonding between supports 12 and 30 while maintaining support 12 under a deformed shape.

System 50 comprises a central finger 52, for example corresponding to a cylinder of axis D, having support 12 resting thereon. System 50 further comprises mobile arms 54 arranged at the periphery of support 12. Each mobile arm 54 comprises, at one end, a gripping element 56, for example, a suction cup or a suction device. Surface 34 of support 12 may be temporarily attached to arms 54. Arms 54 may displace along axes parallel to axis D. In operation, mobile arms 54 are capable of exerting a traction on support 12 at the periphery of surface 34. Since support 12 is maintained by central finger 52, a displacement of arms 54 causes a deformation of support 12 which takes a general bulged shape. Arms 54 may be displaced so that surface 34 reproduces the shape of surface 44 of template 42 shown in FIG. 5. As an example, as shown in FIG. 7, system 50 comprises eight mobile arms 541 to 548 regularly distributed at the periphery of support 12. As an example, support 12 is oriented with respect to arms 541 to 548 so that the plane containing the axes of arms 541 and 545 also contains crystallographic direction [100] or [010]. In this case, the plane containing the axes of arms 543 and 547 also contains crystallographic direction [100] or [010] and the plane containing the axes of arms 542 and 546 or the plane containing the axes of arms 544 and 548 also contains crystallographic direction [110].

System 50 further comprises, as for system 40, an additional arm, not shown, which is capable of applying support 30 against support 12, when support 12 is deformed.

FIGS. 8A to 8E show the structures obtained at successive steps of an embodiment of a method of manufacturing an integrated circuit wafer on an insulating support according to the invention.

Figure 8A:
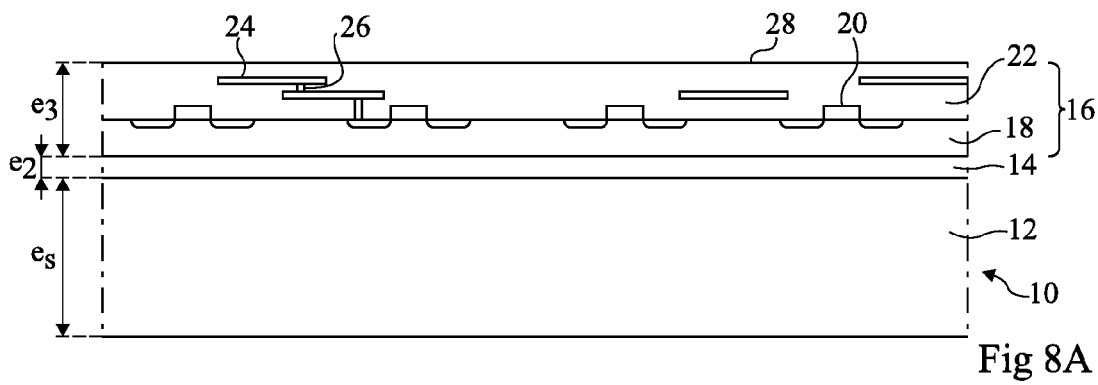
FIGS. 8A to 8E show structures obtained at successive steps of an embodiment of a known method of manufacturing an integrated circuit wafer on an insulating support according to the invention.

FIG. 8A shows a structure identical to the structure shown in FIG. 1A. Thickness es of initial support 12 is for example in the order of 700 micrometers. This corresponds to the standard thickness of the silicon substrates conventionally used in integrated circuit manufacturing methods.

Figure 8B:
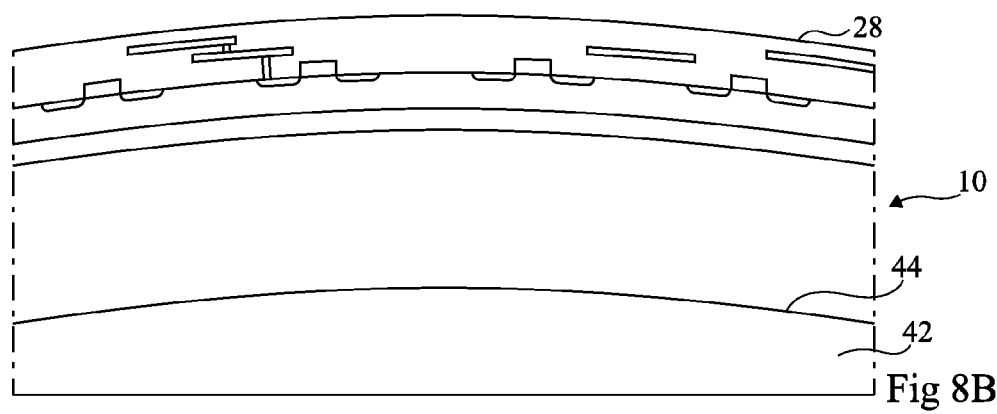

FIG. 8B shows a structure obtained after having deformed element 10, for example, by applying it against surface 44 of template 42 of the deformation system illustrated in FIGS. 4 and 5. Surface 28 then has the same shape as surface 44 such as illustrated in FIG. 5. As a variation, element 10 may be deformed by using system 50 shown in FIGS. 6 and 7.

Figure 8C:
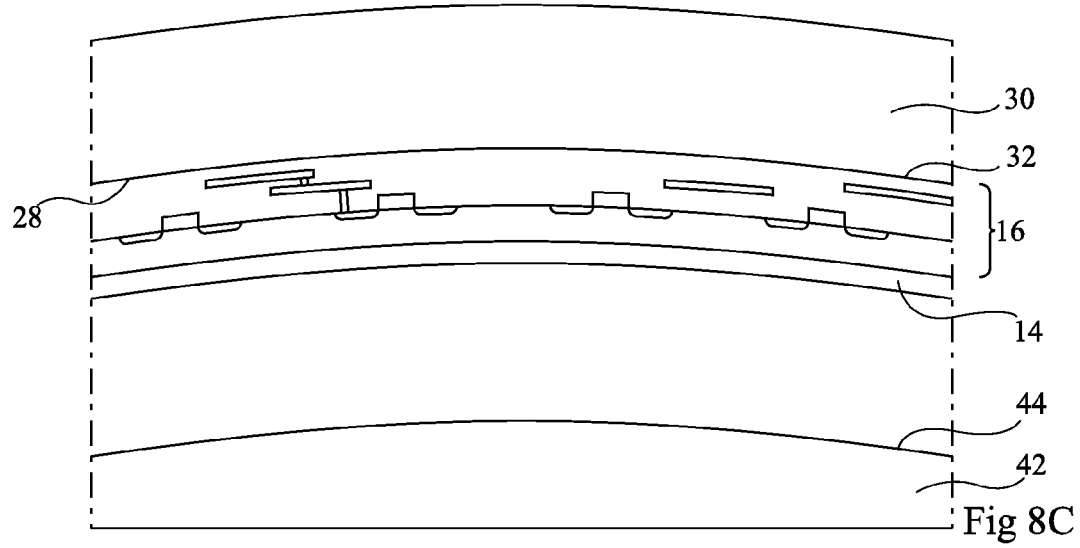

FIG. 8C shows the structure obtained after molecular bonding between the upper insulating layer of stack 16 and final support 30. Final support 30 is made of an isolating and transparent material. It for example is glass. It for example is borosilicate glass commercialized by Corning under trade name Eagle 2000.

In known fashion, the molecular bonding method may comprise steps of preparing surfaces 28 and 32 to be bonded. If need be, a processing may be carried out so that the roughness of surfaces 28 and 32 is adapted to the performing of a molecular bonding. The preparation steps may further comprise cleaning surfaces 28 and 32 to remove most of the particles present on surfaces 28 and 32 having a diameter, for example, greater than 0.2 µm. The preparation steps may further comprise a chemical treatment of surfaces 28 and 32 to promote a molecular bonding of hydrophilic or hydrophobic type.

The bonding may be performed at ambient temperature. The bonding may be initiated by placing surfaces 28 and 32 against each other and by applying a local pressure on one of the supports. The bonding then starts in an initiation area and a bonding propagating front spreads from the initiation area until surface 28 is totally bonded to surface 32. When supports 30 and 12 are cylindrical, the initiation area may be provided in the central region of surfaces 28 and 32. As a variation, the initiation area may be located on one side of surfaces 28 and 32. An anneal step may then be carried out at a temperature lower than the maximum temperature authorized for the materials used. When final support 30 is made of glass, the anneal may be performed up to a temperature from 400° C. to 500° C. for a duration of at least 1 hour, and generally of a plurality of hours, to increase the bonding energy.

Figure 8D:
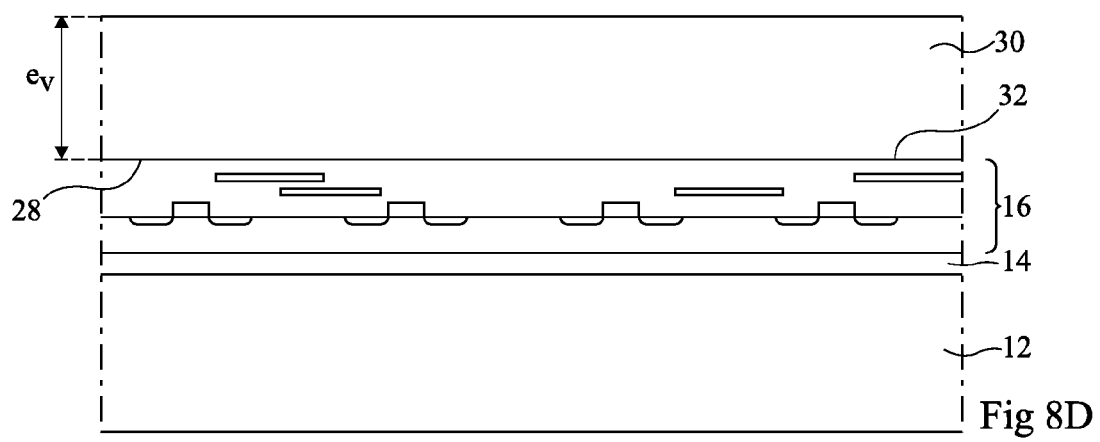

FIG. 8D shows the structure obtained after having stopped the deformation of support 12. Bonded surfaces 28 and 32 recover a substantially planar shape.

Figure 8E:
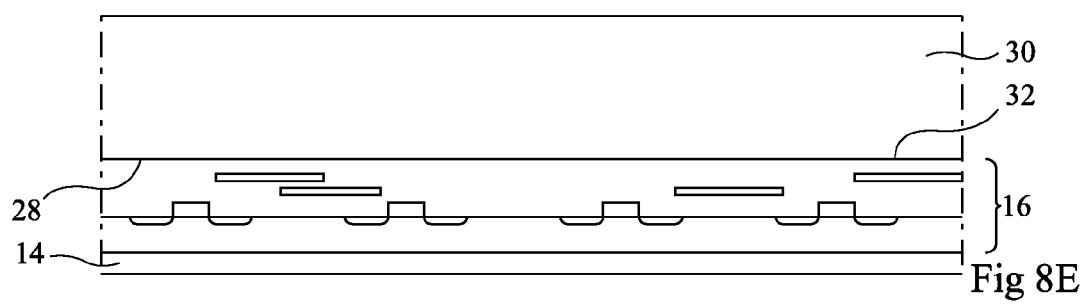

FIG. 8E shows the structure obtained after the removal of initial support 12. The removal of initial support 12 may comprise a step of chem.-mech. polishing to remove most of initial support 12, followed by a step of selective chemical etching to remove the rest of initial support 12. Insulating layer 14 may be used as a stop layer on removal of initial support 12.

The method generally carries on with the forming of conductive vias through insulating layer 14 and silicon layer 12.

Specific embodiments of the present invention have been described. Various alterations and modifications will occur to those skilled in the art. In particular, although in the previously-described embodiment, the final support is made of glass and the initial support is made of silicon, it should be clear that the present invention may apply to the molecular bonding of any type of material having different Young's modules. As an example, the initial support and/or the final support may be made of a semiconductor material, for example, silicon, germanium, or gallium arsenide, of an isolating material, for example, quartz or sapphire, or of any other low-cost material capable of being used to form a handle substrate, for example, a polymer.

The invention claimed is:

1. A method of manufacturing a multilayer structure on a first support made of a first material having a first Young's modulus, the method comprising the successive steps of:
   providing a second support covered with the multilayer structure, the multilayer structure having a planar surface opposite to the second support, the second support being made of a second material having a second Young's modulus different from the first Young's modulus;
   applying to said surface first deformations which vary according to the crystallographic directions of the second support;
   performing a molecular bonding of the first support onto said surface, the molecular bonding causing the occurrence of second deformations in said surface in the absence of the first deformations, the first deformations being opposite to the second deformations; and
   removing the second support, the resulting relative deformations in said surface being smaller than 5 ppm.

2. The manufacturing method of claim 1, wherein said surface is deformed by applying the second support on a template.

3. The manufacturing method of claim 1, wherein said surface is deformed by maintaining the center of the second support fixed and by displacing the periphery of the second support.

4. The manufacturing method of claim 1, wherein the application of the first deformations comprises the stretching of said surface.

5. The manufacturing method of claim 4, wherein the second support is made of single-crystal silicon, wherein said surface is a (001) crystallographic surface, wherein the second support is a cylinder having a rotational symmetry axis (D), and wherein the first deformations have a rotational symmetry of order 4 around said axis.

6. The manufacturing method of claim 5, wherein the application of the first deformations comprises applying, in a first plane containing said axis (D) and crystallographic direction [100] or [010] of the second support, a first spacing, measured along said axis, between the center and the periphery of said surface, and in a second plane containing said axis and crystallographic direction [110] of the second support, a second spacing, measured along said axis, between the center and the periphery of said surface, the first spacing being smaller than the second spacing.

7. The manufacturing method of claim 1, wherein the first material is isolating.

8. The manufacturing method of claim 1, wherein the first material is transparent.

9. The manufacturing method of claim 1, wherein the first material is glass.

10. The manufacturing method of claim 1, wherein the second support is made of single-crystal silicon, wherein said surface is a (001) crystallographic surface, wherein the second support is a cylinder having a rotational symmetry axis (D), and wherein the first deformations have a rotational symmetry of order 4 around said axis.

11. The manufacturing method of claim 2, wherein the second support is made of single-crystal silicon, wherein said surface is a (001) crystallographic surface, wherein the second support is a cylinder having a rotational symmetry axis (D), and wherein the first deformations have a rotational symmetry of order 4 around said axis.

12. The manufacturing method of claim 3, wherein the second support is made of single-crystal silicon, wherein said surface is a (001) crystallographic surface, wherein the second support is a cylinder having a rotational symmetry axis (D), and wherein the first deformations have a rotational symmetry of order 4 around said axis.

13. The manufacturing method of claim 1, wherein the application of the first deformations comprises applying, in a first plane containing said axis (D) and crystallographic direction [100] or [010] of the second support, a first spacing, measured along said axis, between the center and the periphery of said surface, and in a second plane containing said axis and crystallographic direction [110] of the second support, a second spacing, measured along said axis, between the center and the periphery of said surface, the first spacing being smaller than the second spacing.

14. The manufacturing method of claim 2, wherein the application of the first deformations comprises applying, in a first plane containing said axis (D) and crystallographic direction [100] or [010] of the second support, a first spacing, measured along said axis, between the center and the periphery of said surface, and in a second plane containing said axis and crystallographic direction [110] of the second support, a second spacing, measured along said axis, between the center and the periphery of said surface, the first spacing being smaller than the second spacing.

15. The manufacturing method of claim 3, wherein the application of the first deformations comprises applying, in a first plane containing said axis (D) and crystallographic direction [100] or [010] of the second support, a first spacing, measured along said axis, between the center and the periphery of said surface, and in a second plane containing said axis and crystallographic direction [110] of the second support, a second spacing, measured along said axis, between the center and the periphery of said surface, the first spacing being smaller than the second spacing.

16. The manufacturing method of claim 4, wherein the application of the first deformations comprises applying, in a first plane containing said axis (D) and crystallographic direction [100] or [010] of the second support, a first spacing, measured along said axis, between the center and the periphery of said surface, and in a second plane containing said axis and crystallographic direction [110] of the second support, a second spacing, measured along said axis, between the center and the periphery of said surface, the first spacing being smaller than the second spacing.

17. The manufacturing method of claim 2, wherein the application of the first deformations comprises the stretching of said surface.

18. The manufacturing method of claim 3, wherein the application of the first deformations comprises the stretching of said surface.

19. The manufacturing method of claim 1, wherein the application of the first deformations comprises the stretching of said surface, and the second support is made of single-crystal silicon, wherein said surface is a (001) crystallographic surface, wherein the second support is a cylinder having a rotational symmetry axis (D), and wherein the first deformations have a rotational symmetry of order 4 around said axis.

20. The manufacturing method of claim 1, wherein the application of the first deformations comprises the stretching of said surface, and the application of the first deformations comprises applying, in a first plane containing said axis (D) and crystallographic direction [100] or [010] of the second support, a first spacing, measured along said axis, between the center and the periphery of said surface, and in a second plane containing said axis and crystallographic direction [110] of the second support, a second spacing, measured along said axis, between the center and the periphery of said surface, the first spacing being smaller than the second spacing.

* * * * *